(12) United States Patent
Wallace et al.

(10) Patent No.: US 6,503,850 B1
(45) Date of Patent: Jan. 7, 2003

(54) PROCESS FOR PRODUCING NANOPOROUS DIELECTRIC FILMS AT HIGH PH

(75) Inventors: Stephen Wallace, Albuquerque, NM (US); Douglas M. Smith, Albuquerque, NM (US); Teresa Ramos, Albuquerque, NM (US); Kevin H. Roderick, Albuquerque, NM (US); James S. Drage, Fremont, CA (US); Lisa Beth Brungardt, Albuquerque, NM (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/046,473

(22) Filed: Mar. 25, 1998

Related U.S. Application Data

(60) Provisional application No. 60/044,080, filed on Apr. 17, 1997.

(51) Int. Cl.[7] .............................................. H01L 21/469
(52) U.S. Cl. ...................... 438/782; 438/787; 438/624; 438/781
(58) Field of Search ................................ 438/787, 781, 438/782, 790, 624

(56) References Cited

U.S. PATENT DOCUMENTS

| 5,409,683 A | 4/1995 | Tillotson et al. ............ 423/338 |
| 5,736,425 A | * 4/1998 | Smith et al. ................ 438/778 |

FOREIGN PATENT DOCUMENTS

| EP | 0775669 | 5/1997 |
| WO | WO 9203378 | 5/1993 |

OTHER PUBLICATIONS

Lewis, Richard J., "Hawley's Condensed Chemical Dictionary" 12th ed. USPTO Scientific Library, p. 52, 1993.*
Weast, Robert C.; Lide, David R.; Astel, Melvin J.; Beyer, William H.. "CRC Handbook of Chemistry and Physics" 70th ed. pp. C–267, C–508, 1974.*
Jo, et al: "Evaluation of SiO2 aerogel thin films with ultra low dielectric constant as an intermatal dielectric", Microelectronic Engineering, vol. 33, No. 1, Jan. 1997, p. 343–348. XP004054530.
Jo, et al: "Application of SiO2 aerogel film with low dielectric constant to intermetal dielectrics", Thin Solid Films, vol. 308–309, No. 1–4, Oct. 31, 1997, p. 490–494. XP004110323.

* cited by examiner

*Primary Examiner*—Matthew Smith
*Assistant Examiner*—Renzo N. Rocchegiani
(74) *Attorney, Agent, or Firm*—Roberts & Mercanti, LLP

(57) ABSTRACT

The present invention relates to nanoporous dielectric films and to a process for their manufacture. Such films are useful in the production of integrated circuits. A precursor of an alkoxysilane, and low and high volatility solvents are mixed at a pH of about 2–5, raised to a pH of about 8 or above with a low volatility base and deposited on a semiconductor substrate. After exposure to atmospheric moisture, a nanoporous dielectric film is produced on the substrate.

20 Claims, 1 Drawing Sheet

PROCESS FOR PRODUCING NANOPOROUS DIELECTRIC FILMS AT HIGH PH

CROSS REFERENCE TO RELATED APPLICATION

This application claims the benefit of provisional application No. 60/044,080 filed Apr. 17, 1997 which is incorporated herein by reference.

BACKGROUND OF THE INVENTION

1. Field of the Invention

The present invention relates to nanoporous dielectric films and to a process for their manufacture. Such films are useful in the production of integrated circuits.

2. Description of the Prior Art

In the production of integrated circuits, the problems of interconnect RC delay, power consumption and crosstalk become more significant as feature sizes approach 0.25 μm and below. The use of low dielectric constant (K) materials for interlevel dielectric and intermetal dielectric applications partially mitigate these problems but each of the material candidates having dielectric constants significantly lower than the currently employed dense silica suffer from disadvantages. Most low dielectric constant materials developments use spin-on-glasses and fluorinated plasma chemical vapor disposition $SiO_2$ with K of >3. Some organic and inorganic polymers have dielectric constants in the range of about 2.2 to 3.5, however, these have the problems of low thermal stability, poor mechanical properties including low glass transition temperature, sample outgassing, and long term reliability questions.

Another approach has been to employ nanoporous silica which can have dielectric constants in the range of about 1 to 3. Porous silica is attractive because it employs similar precursors, for example tetraethoxysilane (TEOS) as used for spun-on glass (SOG's) and CVD $SiO_2$ and due to the ability to carefully control pore size and size distribution. In addition to low dielectric constant, nanoporous silica offers other advantages for microelectronics including thermal stability up to 900° C., small pore size (<<microelectronics features), use of materials, namely silica and precursors that are widely used in the semiconductor industry, the ability to tune dielectric constant over a wide range and deposition using similar tools as employed for conventional spun-on glass processing.

High porosity leads to a lower dielectric constant than corresponding dense materials, and additional compositions and processes may be introduced as compared to a denser material. Materials issues include the need for having all pores significantly smaller than circuit feature sizes, the strength decrease associated with porosity, and the role of surface chemistry on dielectric constant and environmental stability. Density (or the inverse, porosity) is the key nanoporous silica parameter controlling property of importance for dielectrics. Properties of nanoporous silica may be varied over a continuous spectrum from the extremes of an air gap at a porosity of 100% to dense silica with a porosity of 0%. As density increases, dielectric constant and mechanical strength increase but the pore size decreases. This suggests that the optimum density range for semiconductor applications is not the very low densities associated with K~1 but rather, higher densities which yield higher strength and smaller pore size.

Nanoporous silica films can be fabricated by using a mixture of a solvent and a silica precursor which is deposited onto a silicon wafer by conventional methods of spincoating, dip-coating, etc. The precursor polymerizes after deposition and the resulting layer is sufficiently strong such that it does not shrink during drying. Film thickness and density/dielectric constant can be controlled independently by using a mixture of two solvents with dramatically different volatility. The more volatile solvent evaporates during and immediately after precursor deposition. The silica precursor, typically, a partially hydrolyzed and condensed product of TEOS, is polymerized by chemical and/or thermal means until it forms a gel layer. The solvents are then removed by increasing the temperature. Assuming that no shrinkage occurs after gelation, the density/dielectric constant of the final film is fixed by the volume ratio of low volatility solvent to silica. EP patent application EP 0 775 669 A2, which is incorporated herein by reference, shows a method for producing a nanoporous silica film with uniform density throughout the film thickness. The preferred method for producing nanoporous dielectrics is through the use of sol-gel techniques whereby a sol, which is a colloidal suspension of solid particles in a liquid, transforms into a gel due to growth and interconnection of the solid particles. One theory is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid.

For nanoporous silica, starting materials are silanes such as alkoxysilanes. Because of their high volatility and low viscosity, these precursors are first hydrolyzed with small amounts of water and optional acid catalyst under reflux conditions. At room temperature or below, these solutions have sufficient stability such that their shelf life is in excess of six months. In order to form a gel from this solution, additional catalyst and reactant (water) is added. The relative rates of hydrolysis and condensation are strongly dependent on pH. For hydrolysis, the rate is very high at pH~2 and decreases exponentially to a minimum at pH~7. At higher pH, the hydrolysis rate increases exponentially. For condensation, the rate is slowest at pH~2 and increases to a maximum at pH~8–9.

It has been possible to add catalyst/water shortly before deposition by mixing two fluids together or after deposition by vapor exposure. However, if the catalyst is added before deposition, deposition problems arise from the changing solution viscosity as the polymers grow and the fact that the catalyst/water must be added to a small amount of precursor for each wafer. The addition of catalyst and water via a vapor phase eliminates those problems but involves safety and equipment issues associated with handling volatile bases such as ammonia.

SUMMARY OF THE INVENTION

The invention provides a process for forming a nanoporous dielectric coating on a substrate which comprises the steps of:

(a) blending at least one alkoxysilane with a relatively high volatility solvent composition, a relatively low volatility solvent composition, and optional water to thus form a mixture having a pH of about 2 to about 5, and causing a partial hydrolysis and partial condensation of the alkoxysilane;

(b) adding a sufficient amount of a base to the result of step (a) to raise the pH of the mixture to about 8 or above;

(c) depositing the raised pH mixture resulting from step (b) onto a substrate while evaporating at least a portion of the relatively high volatility solvent composition;

(d) exposing the result from step (c) to a water vapor; and (e) evaporating the relatively low volatility solvent composition.

The invention also provides a semiconductor device produced by the process which comprises the steps of:

(a) blending at least one alkoxysilane with a relatively high volatility solvent composition, a relatively low volatility solvent composition, and optional water to thus form a mixture having a pH of about 2 to about 5, and causing a partial hydrolysis and partial condensation of the alkoxysilane;

(b) adding a sufficient amount of a base to the result of step (a) to raise the pH of the mixture to about 8 or above;

(c) depositing the raised pH mixture resulting from step (b) onto a substrate while evaporating at least a portion of the relatively high volatility solvent composition;

(d) exposing the result from step (c) to a water vapor; and (e) evaporating the relatively low volatility solvent composition.

It has now been found that a low dielectric constant nanoporous silica film can be produced by the post deposition step of exposing a deposited film to moisture, such as atmospheric moisture. In this procedure, a base is mixed into a sol in order to catalyze the gelation and aging reactions once a sufficient amount of water has been introduced into the system. The base may be in the form of an amine in order to maintain basicity while decreasing the volatility of the base.

This invention avoids the problems of adding catalyst shortly before deposition or in the vapor phase after deposition but still retains good shelf life. The invention performs the reactions in a particular order which is different than other sol-gel processes. According to the invention, the silane is first hydrolyzed by adding a substoichiometric amount of water and sufficient acid to maintain the pH of about 2 to 5 (conditions of rapid hydrolysis and slow condensation). The pH of the solution is then raised to a region in which the condensation rate is high (pH>8). Although some condensation occurs, the solution will not gel as there is insufficient water. This solution is stable until deposition. During deposition and shortly thereafter, the film will rapidly absorb atmospheric water which will enable the deposited solution to gel. This process is aided by the cooling of the film precursor that occurs as a result of the rapid evaporation of the high volatility solvent. The gelled film then may be processed through a series of heating steps to remove remaining solvent and produce the low density nanoporous silica film. This process may be employed on either a patterned wafer if an insulator on metal approach is being used or on a plain wafer for a Damanscene process.

It would be desirable to produce a low density, low dielectric constant nanoporous silica by merely exposing a deposited film to moisture, such as atmospheric moisture.

DETAILED DESCRIPTION OF THE PREFERRED EMBODIMENT

Figure 1:
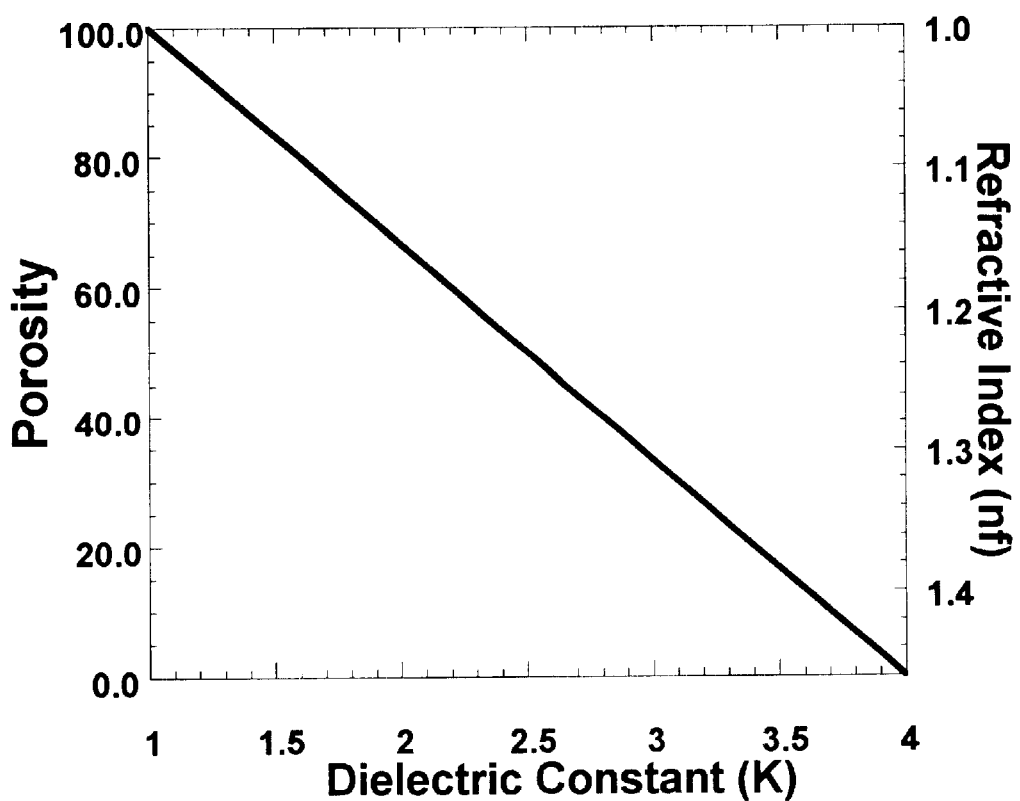
FIG. 1 shows a graph presenting a relationship among film porosity, dielectric constant and refractive index.

The invention forms a reaction product of at least one alkoxysilane with a relatively high volatility solvent composition, a relatively low volatility solvent composition, optional water and an optional catalytic amount of an acid such that the reaction product has a pH in the range of from about 2 to about 5. Water is preferably included to provide a medium for partially hydrolyzing the alkoxysilane. Thereafter, a low volatility base, such as an amine is added to raise the pH to about 8 or above. This reaction product is applied onto a substrate. The high volatility solvent evaporates during and immediately after deposition of the reaction product and the reaction product is further hydrolyzed and condensed until it forms a gel layer. The second solvent is then removed by increasing the temperature.

Useful alkoxysilanes for this invention include those which have the formula:

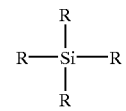

balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The relatively high volatility solvent composition is one which evaporates at a temperature below, preferably significantly below that of the relatively low volatility solvent composition. The relatively high volatility solvent composition preferably has a boiling point of about 120° C. or less, preferably about 100° C. or less. Suitable high volatility solvent composition nonexclusively include methanol, ethanol, n-propanol, isopropanol, n-butanol and mixtures thereof Other relatively high volatility solvent compositions which are compatible with the other ingredients can be readily determined by those skilled in the art.

The relatively low volatility solvent composition is one which evaporates at a temperature above, preferably significantly above that of the relatively high volatility solvent composition. The relatively low volatility solvent composition preferably has a boiling point of about 175° C. or more, preferably about 200° C. or more. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The optional acid serves to catalyze the reaction of the alkoxysilane with the relatively high volatility solvent composition, the relatively low volatility solvent composition and water. Suitable acids are nitric acid and compatible organic acids which are volatile, i.e. which evaporate from the resulting reaction product under the process operating conditions, and which do not introduce impurities into the reaction product.

The alkoxysilane component is preferably present in an amount of from about 3% to about 50% by weight of the overall mixture. A more preferred range is from about 5% to about 45% and most preferably from about 10% to about 40%.

The high volatility solvent composition component is preferably present in an amount of from about 20% to about 90% by weight of the overall mixture. A more preferred range is from about 30% to about 70% and most preferably from about 40% to about 60%.

The low volatility solvent composition component is preferably present in an amount of from about 1 to about 40% by weight of the overall mixture. A more preferred range is from about 3% to about 30% and most preferably from about 5% to about 20%.

The mole ratio of water to silane is preferably from about 0 to about 2. A more preferred range is from about 0.1 to about 1.5 and most preferably from about 0.5 to about 1.2.

The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

In the preferred embodiment, the alkoxysilane, low and high volatility solvents, and optional water and acid are mixed under reflux and then allowed to cool. Thereafter the base is added in an amount sufficient to raise the pH to about 8 or above, preferably from about 8 to about 12. This should be accomplished without raising the water content of the precursor beyond a point at which it becomes unstable when stored over a period of months. The base used to adjust the pH should have a low volatility in order to remain in the film during subsequent water vapor treatment; should be miscible in the high and low volatility solvents; should have a high $pK_b$ in order to achieve rapid reaction/wafer throughput; should be removable at typical semiconductor processing temperatures after which it should not leave residual impurities which are detrimental to film and semiconductor properties; and should yield sufficient stability for the precursor. Suitable bases nonexclusively include amines, such as primary, secondary and tertiary alkyl amines, aryl amines, alcohol amines and mixtures thereof which have a boiling point of about 100° C. or higher, preferably about 125° C. or higher and more preferably about 150° C. or higher. Preferred amines are monoethanolamine, diethanolamine, triethanolamine, monoisopropanolamine, tetraethylenepentamine, 2-(2-aminoethoxy)ethanol; 2-(2-aminoethylamino)ethanol and mixtures thereof. The ability of an amine to accept a proton in water is measured in terms of the basicity constant $K_b$, and $pK_b=-\log K_b$. In the preferred embodiment, the $pK_b$ of the base may range from about less than 0 to about 9. A more preferred range is from about 2 to about 6 and most preferably from about 4 to about 5. The base may be added to the precursor during initial hydrolysis and condensation of the silane precursor or in a subsequent step.

The high pH reaction product is then coated on a substrate and forms a dielectric film on the surface. Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof Optionally on the surface of the substrate is a pattern of raised lines, such as metal, oxide, nitride or oxynitride lines which are formed by well known lithographic techniques. Such are typically closely separated from one another at distances of about 20 micrometers or less, preferably 1 micrometer or less, and more preferably from about 0.05 to about 1 micrometer. Suitable materials include silica, silicon nitride, titanium nitride, tantalum nitride, aluminum, aluminum alloys, copper, tantalum, tungsten and silicon oxynitride.

The higher volatility layer is then partially evaporated. The more volatile solvent evaporates over a period of seconds or minutes. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more range from about 20° C. to about 35° C.

Then the coating is exposed to water vapor. According to the invention, the nanoporous silica precursor is prepared with a high pH (>8) but with a water content significantly less than stoichiometric. Therefore, as soon as the precursor is exposed to atmospheric moisture, it begins to polymerize and gel. In principle, the higher the moisture content of the air in contact with the precursor film, the shorter is the required reaction time necessary to achieve a high quality, low density film. The polymerization/gelation reactions may be conducted by several means. For example, ambient moisture at a relative humidity of about 40 to 60% is sufficient to cause gelation and a wet gel film sufficiently strongly as to yield low density (dielectric constant <2.5). However, if this moisture addition method used, film properties may vary as a result of the difficulty of accurately controlling the humidity in the room. Alternatively, an apparatus for the controlled application of moisture may be used.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. Continued exposure to water results in continued hydrolysis of alkoxy groups forming silanols and the generation of volatile alcohols which leave the coating film. The film is then dried in a conventional way by solvent evaporation of the less volatile solvent with no further shrinkage. Elevated temperatures may be employed to dry the coating in this step. Such temperatures may range from about 20° C. to about 450° C., preferably from about 50° C. to about 350° C. and more preferably from about 175° C. to about 320° C. As a result, low dielectric constant, silicon containing polymer composition forms on the substrate. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^2$, more preferably from about 0.25 to about 1.6 $g/cm^2$, and most preferably from about 0.4 to about 1.2 $g/cm^2$.

When one processes the coating with high base (catalyst) concentration and limited water vapor, the silica polymer polymerizes and gels with significant concentration of alkoxy groups remaining on the internal silica surface. After hydrolysis, the alkoxy groups hydrolyze and the product alcohol evaporates. The dielectric constant (density) depends on the target dielectric constant formulation which is fixed by the solvent to silica volumetric ratio, the size of the alkoxy groups and the ratio of alkoxy groups per silicon atoms at the point when the silica polymer has gelled. When processed according to this invention, the OR/Si ratio at the gelation point is from about 0.2 to about 2. For example, if the OR/Si ratio is one, one uses ethoxy groups, and the target dielectric constant is 2.5, significant differential dielectric constants will be observed. For different alkoxy groups, as the molar volume of the alkoxy group increases (n-butoxy>ethoxy>methoxy), the extent of differential dielectric constant increases. The extent of shrinkage after gelation and before final cure is a good measure of the volume change from dealkoxylation.

The following non-limiting examples serve to illustrate the invention.

EXAMPLE 1 (COMPARATIVE)

This example illustrates a process wherein no amine is added to a precursor. The precursor is spin deposited onto a silicon wafer, aged for various times at a constant relative humidity, and dried.

A precursor was made by mixing, while stirring, 122 ml tetraethoxysilane, 61 ml triethyleneglycol monomethyl ether, 9.74 ml deionized water (deionized), and 0.4 ml 1M nitric acid (Conc. $HNO_3$, diluted to 1M). This mixture was then refluxed while stirring continued for 1.5 hours and then cooled. A portion of this precursor was then diluted 50% by weight with ethanol while stirring. Approximately 1.5 ml of this diluted precursor was deposited onto a 4 inch silicon wafer on a spin chuck, and spun on at 2500 rpm for 30 seconds. The wafer was then placed in an aging chamber where compressed air was flowed through a bubbler and into the chamber at a rate of 2 l/min. to produce a relative humidity of 75% within the chamber. The wafer was left in the chamber for 60 seconds, then removed and dried in an oven at 170° C. for 3 minutes, followed by another oven dry at 320° C. The wafer was then cooled and the film measured using Ellipsometry to determine its thickness and refractive index. Refractive index can be correlated to the film porosity. A refractive index of 1.0 is 100% porosity and 1.46 is dense, 0% porosity silica. The relationship among film porosity, dielectric constant and refractive index may be estimated from FIG. 1. Three other films were deposited using the diluted sol and processed in the same manner with the exception that they were left in the 75% relative humidity aging chamber for different periods of time before removal and drying. The aging times were 2 minutes, 3 minutes, and 5 minutes. Results are shown in the table below.

| Aging Time (minutes) | Thickness (Å) | Refractive Index |
| --- | --- | --- |
| 1 | 1250 | 1.414 |
| 2 | 1250 | 1.424 |
| 3 | 1150 | 1.404 |
| 5 | 950 | 1.418 |

EXAMPLE 2

This example illustrates a process wherein an amine is added to a precursor. The precursor is then spin deposited onto a silicon wafer, aged for various times at a constant relative humidity, and dried. A precursor was made by mixing, while stirring, 122 ml tetraethoxysilane, 61 ml triethyleneglycol monomethyl ether, 9.74 ml deionized water, and 0.4 ml 1M nitric acid. This mixture was then refluxed while stirring continued for 1.5 hours, then cooled. Next, a sol was created by removing 50 ml of the above precursor and adding 4.53 ml of monoethanolamine while stirring. This sol was left to stabilize overnight. A portion of the sol (approximately 4 ml) was then diluted 50% by weight with ethanol, while stirring. Approximately 1.5 ml of this diluted sol was then dispensed onto a 4 inch silicon wafer on a spin chuck, and spun on at 2500 rpm for 30 seconds. The wafer was then placed in an aging chamber where compressed air was flowed through a bubbler and into the chamber at a rate of 2 l/min. through the chamber in order to produce a relative humidity of 75% within the chamber. The wafer was left in the chamber for 60 seconds, then removed and dried in an oven at 170° C. for 3 minutes, followed by another oven dry at 320° C. The wafer was then cooled and the film measured using Ellipsometry to determine its thickness and refractive index. Four other films were deposited using the diluted sol and processed in the same manner with the exception that they were left in the 75% relative humidity aging chamber for different periods of time before removal and drying. The aging times were 2 minutes, 3 minutes, 5 minutes, and 10 minutes. Results are shown in the table below.

| Aging Time (minutes) | Thickness (Å) | Refractive Index |
| --- | --- | --- |
| 1 | 3200 | 1.232 |
| 2 | 3700 | 1.176 |
| 3 | 4150 | 1.149 |
| 5 | 4850 | 1.134 |
| 10 | 5600 | 1.113 |

EXAMPLE 3

This example illustrates a process wherein an amine is added to a precursor. The precursor is then spin deposited onto a silicon wafer, aged for various times at a constant relative humidity, and either dried directly in a 170° C. oven or silylated before oven drying. A precursor was made by mixing, while stirring, 184.5 ml tetraethoxysilane, 75 ml triethyleneglycol monomethyl ether, 14.8 ml deionized water, and 0.61 ml 1M nitric acid. This mixture was then refluxed while stirring continued for 1.5 hours, then cooled. Next, a sol was created by removing 50 ml of the above precursor adding 5.23 ml monoethanolamine and 2.88 ml triethyleneglycol monomethyl ether while stirring. This sol was left to stabilize overnight. A portion of the sol (approximately 4 ml) was then diluted 50% by weight with ethanol, while stirring. Approximately 1.5 ml of this diluted sol was then dispensed onto a 4 inch silicon wafer on a spin chuck, and spun on at 2500 rpm for 30 seconds. Four films were deposited in such a way. Wafers 1 and 2 were placed into an aging chamber with compressed air flowing through a water bubbler at a rate of 2 l/min. into the chamber in order to obtain a relative humidity of 75%, and were aged for 3 minutes and 5 minutes respectively. After this time the samples were dried by placing them in a 170° C. oven for 3 minutes, followed by a second oven at 320° C. for 3 minutes. Measurements were taken using Ellipsometry in order to determine the thickness and refractive index of the final film after the wafer had cooled to ambient temperature. The results of the measurements are shown on the table below. Films 3 and 4 were aged in an identical manner as the first two (i.e. 3 minutes and 5 minutes at 75% relative humidity respectively. After aging, each film was placed back on the spin chuck and washed with 30 ml of a solution comprised of 15 ml acetone mixed with 15 ml hexamethyldisilazane.

The wafer was spun at 250 rpm for 15 second while the film was being washed, then the speed was increased to 1000 rpm for 15 more seconds, allowing the film to evaporate dry on the chuck. This solution was mixed at least one hour previous to use, but was not mixed more than 8 hours before use. After the film had been washed, the wafer was placed in a 170° C. oven for 3 minutes followed by a 320° C. oven for 3 minutes. The wafers were then removed and measured by Ellipsometry for thickness and refractive index. The results of the measurements are shown on the table below.

| Wafer | Aging Time (minutes) | Wash (yes/no) | Thickness (Å) | Refractive Index |
|---|---|---|---|---|
| 1 | 3 | no | 5100 | 1.191 |
| 2 | 5 | no | 5450 | 1.166 |
| 3 | 3 | yes | 9700 | 1.176 |
| 4 | 5 | yes | 10350 | 1.135 |

EXAMPLE 4

This example illustrates a process wherein an amine is added to a precursor. The precursor is then spin deposited onto a silicon wafer, aged for a set time at varied relative humidity, and either dried directly in a 170° C. oven. A precursor was made by mixing, while stirring, 122 ml tetraethoxysilane, 61 ml triethyleneglycol monomethyl ether, 9.74 ml deionized water, and 0.4 ml 1M nitric acid. This mixture was then refluxed while stirring continued for 1.5 hours, then cooled. Next, a sol was created by removing 50 ml of the above precursor adding 3.57 ml monoethanolamine while stirring. This sol was left to stabilize overnight. A portion of the sol (approximately 4 ml) was then diluted 50% by weight with ethanol, while stirring. Approximately 1.5 ml of this diluted sol was then dispensed onto a 4 inch silicon wafer on a spin chuck, and spun on at 2500 rpm for 30 seconds. Two such films were deposited in such a way. The first wafer was left to age on the chuck for 3 minutes at an ambient relative humidity of 32%. After this time the wafer was dried by placing it in a 170° C. oven for 3 minutes followed by a 320° C. oven for 3 minutes. The second wafer was placed into an aging chamber with compressed air flowing through a water bubbler at a rate of 2 l/min. into the chamber in order to obtain a relative humidity of 75%, and was aged there for 3 minutes. After this time the wafer was dried by placing it in a 170° C. oven for 3 minutes followed by a 320° C. oven for 3 minutes. After each wafer had been allowed to cool, the films were measured by Ellipsometry for thickness and refractive index. The results of the measurements are shown on the table below.

| Aging Relative Humidity | Thickness (Å) | Refractive Index |
|---|---|---|
| 32% | 3750 | 1.178 |
| 75% | 4800 | 1.139 |

EXAMPLE 5

This example illustrates a process wherein various amounts of an amine are added to a precursor. The precursor is then spin deposited onto a silicon wafer, aged for a set time at a set relative humidity, and silylated before oven drying. A precursor was made by mixing, while stirring, 184.5 ml tetraethoxysilane, 75 ml triethyleneglycol monomethyl ether, 14.8 ml deionized water, and 0.61 ml 1M nitric acid. This mixture was then refluxed while stirring continued for 1.5 hours, then cooled. Next, the first sol was created by removing 50 ml of the above precursor adding 2.91 ml 2-(2-aminoethoxy)ethanol and 5.20 ml triethyleneglycol monomethyl ether while stirring. This created a sol in which the 2-(2-aminoethoxy)ethanol accounts for 5% by volume of the undiluted sol. This sol was left to stabilize overnight. A portion of the sol (approximately 4 ml) was then diluted 50% by weight with ethanol, while stirring. Approximately 1.5 ml of this diluted sol was then dispensed onto a 4 inch silicon wafer on a spin chuck, and spun on at 2500 rpm for 30 seconds. A second sol was created by removing 50 ml of the above precursor adding 5.23 ml 2-(2-aminoethoxy)ethanol and 2.88 ml triethyleneglycol monomethyl ether while stirring. This created a sol in which the 2-(2-aminoethoxy)ethanol accounts for 11% by volume of the undiluted sol. This sol was left to stabilize overnight. A portion of the sol (approximately 4 ml) was then diluted 50% by weight with ethanol, while stirring. Approximately 1.5 ml of this diluted sol was then dispensed onto a 4 inch silicon wafer on a spin chuck, and spun on at 2500 rpm for 30 seconds. A third sol was created by removing 50 ml of the above precursor adding 6.39 ml of 2-(2-aminoethoxy)ethanol and 1.72 ml triethyleneglycol monomethyl ether while stirring. This created a sol in which the 2-(2-aminoethoxy)ethanol accounts for 11% by volume of the undiluted sol. This sol was left to stabilize overnight. A portion of the sol (approximately 4 ml) was then diluted 50% by weight with ethanol, while stirring. Approximately 1.5 ml o f this diluted sol was then dispensed onto a 4 inch silicon wafer on a spin chuck, and spun on at 2500 rpm for 30 seconds. All three wafers were then placed into an aging chamber with compressed air flowing through a water bubbler at a rate of 2 l/min. into the chamber for 20 seconds, after which the flow was shut off. This was done in order to obtain a relative humidity of 45%, and each wafer was aged there for 3 minutes. After aging, each film was placed back on the spin chuck and washed with 30 ml of a solution comprised of 15 ml acetone mixed with 15 ml hexamethyldisilazane. The wafer was spun at 250 rpm for 15 second while the film was being washed, then the speed was increased to 1000 rpm for 15 more seconds, allowing the film to evaporate dry on the chuck. This solution was mixed at least one hour previous to use, but was never mixed more than 8 hours before use. After the film had been washed, the wafer was placed in a 170° C. oven for 3 minutes followed by a 320° C. oven for 3 minutes. The wafers were then removed and measured by Ellipsometry for thickness and refractive index. The results of the measurements are shown on the table below.

| Volume Percent 2-(2-aminoethoxy) ethanol | Thickness (Å) | Refractive Index |
|---|---|---|
| 5% | 4750 | 1.280 |
| 9% | 6300 | 1.250 |
| 11% | 6550 | 1.234 |

It can be seen from these examples that a low dielectric constant nanoporous silica film can be produced by the post deposition step of exposing a deposited film to moisture, such as atmospheric moisture. The invention avoids the problems of adding catalyst shortly before deposition or in the vapor phase after deposition but still retains good shelf life.

What is claimed is:

1. A process for forming a nanoporous dielectric coating on a substrate which comprises the steps of:
   (a) blending at least one alkoxysilane with a high volatility solvent composition, a low volatility solvent composition, and optional water, wherein the mole ratio of water to silane is from about 0 to about 2, to thus form a mixture having a pH of about 2 to about 5, and causing a partial hydrolysis and partial condensation of the alkoxysilane;
   (b) adding a sufficient amount of a base to the result of step (a) to raise the pH of the mixture to about 8 or above;
   (c) depositing the raised pH mixture resulting from step (b) onto a substrate while evaporating at least a portion of the high volatility solvent composition;
   (d) exposing the result from step (c) to sufficient water vapor to cause gellation; and
   (e) evaporating the low volatility solvent composition.

2. The process of claim 1 wherein step (a) comprises blending water in the mixture.

3. The process of claim 1 wherein step (a) further comprises blending a catalytic amount of an acid in the mixture.

4. The process of claim 1 wherein the alkoxysilane comprises tetraethoxysilane.

5. The process of claim 1 wherein the alkoxysilane comprises tetramethoxysilane.

6. The process of claim 1 wherein the high volatility solvent composition has a boiling point of about 120° C. or less.

7. The process of claim 1 wherein the low volatility solvent composition has a boiling point of about 175° C. or more.

8. The process of claim 1 wherein the high volatility solvent composition comprises one or more components selected form the group consisting of methanol, ethanol, n-propanol, isopropanol, n-butanol and mixtures thereof.

9. The process of claim 1 wherein the low volatility solvent composition comprises an alcohol or a polyol.

10. The process of claim 1 wherein the base comprises at least one amine.

11. The process of claim 1 wherein the base is selected from the group consisting of primary, secondary and tertiary alkyl amines, aryl amines, alcohol amines and mixtures thereof which have a boiling point of about 100° C. or above.

12. The process of claim 1 wherein the base is selected from the group consisting of monoethanolamine, diethanol amine, triethanol amine, monoisopropanol amine, tetraethylenepentamine, 2-(2-aminoethoxy)ethanol; 2-(2-aminoethylamino)ethanol and mixtures thereof.

13. The process of claim 1 wherein the base has a $pK_b$ of from about less than 0 to about 9.

14. The process of claim 1 wherein the alkoxysilane has the formula:

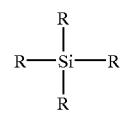

wherein at least 2 of the R groups are independently $C_1$ to $C_4$ alkoxy groups and the balance, if any, are independently selected from the group consisting of hydrogen, alkyl, phenyl, halogen, substituted phenyl.

15. The process of claim 14 wherein each R is methoxy, ethoxy or propoxy.

16. The process of claim 1 wherein the resulting nanoporous coating has a dielectric constant of from about 1.1 to about 3.5.

17. The process of claim 1 wherein the resulting nanoporous coating has a pore size of from about 1 nm to about 100 nm.

18. The process of claim 1 wherein substrate comprises a raised pattern of lines on its surface which comprises a metal, an oxide, a nitride and/or an oxynitride material.

19. The process of claim 1 wherein the substrate comprises a semiconductor material.

20. The process of claim 1 wherein the substrate comprises silicon or gallium arsenide.

* * * * *